US007492914B2

(12) United States Patent
Arvidsson

(10) Patent No.: US 7,492,914 B2
(45) Date of Patent: Feb. 17, 2009

(54) AUDIO RECEIVING SYSTEM

(75) Inventor: Olof Arvidsson, Lund (SE)

(73) Assignee: Arva Trade, Solna (SE)

( * ) Notice: Subject to any disclaimer, the term of this patent is extended or adjusted under 35 U.S.C. 154(b) by 776 days.

(21) Appl. No.: 10/092,558

(22) Filed: Mar. 8, 2002

(65) Prior Publication Data

US 2003/0169890 A1 Sep. 11, 2003

(51) Int. Cl.

| | |
|---|---|
| ***H04R 3/00*** | (2006.01) |
| ***H04R 1/02*** | (2006.01) |
| ***H04B 1/00*** | (2006.01) |
| ***H04B 3/00*** | (2006.01) |
| ***H04B 7/15*** | (2006.01) |
| ***H04B 7/00*** | (2006.01) |
| ***G10H 1/00*** | (2006.01) |
| ***H03G 9/00*** | (2006.01) |
| ***H03G 3/00*** | (2006.01) |
| ***H04H 7/00*** | (2006.01) |

(52) U.S. Cl. .......................... 381/92; 381/91; 381/119; 381/122; 381/118; 381/80; 381/81; 381/77; 381/102; 381/109; 455/11.1; 455/500; 455/3.06

(58) Field of Classification Search ................ 381/118, 381/119, 80, 81, 77, 85, 92, 122, 2, 111, 381/19; 379/40, 42, 44; 455/3.06; 370/40, 370/42, 44

See application file for complete search history.

(56) References Cited

U.S. PATENT DOCUMENTS

| | | | | |
|---|---|---|---|---|
| 4,479,240 | A * | 10/1984 | McKinley, Jr. | 381/80 |
| 4,918,717 | A * | 4/1990 | Bissonnette et al. | 379/40 |
| 4,993,073 | A * | 2/1991 | Sparkes | 381/119 |
| 5,422,955 | A | 6/1995 | Guzman et al. | |
| 5,966,639 | A * | 10/1999 | Goldberg et al. | 455/11.1 |
| 6,246,773 | B1 | 6/2001 | Eastty | |

FOREIGN PATENT DOCUMENTS

| | | |
|---|---|---|
| JP | 05127688 A | 5/1993 |
| WO | WO 93/10613 | 5/1993 |

OTHER PUBLICATIONS

"Phantom Power and Bias Voltage—Is There a Difference?"; Shure Incorporated, 1996-2000, pp. 1-2.

* cited by examiner

*Primary Examiner*—Vivian Chin
*Assistant Examiner*—Devona E Faulk
(74) *Attorney, Agent, or Firm*—Birch, Stewart, Kolasch & Birch, LLP

(57) ABSTRACT

A system is provided for receiving audio signals from a plurality of microphones and transferring the audio signals via a common composite signal channel to a receiving unit, such as a mixing console. The system has at least two satellite units, each having a microphone signal input, a composite signal channel input and summing means for summing a microphone signal and a composite signal. The system further has a master unit with a composite signal channel input, and signal converting means for converting said composite signal into a master signal, which is provided to the receiving unit via a master signal output. In the system, each satellite unit is connected to the common composite signal channel, such that the microphone signal received at the respective satellite unit, is added to the composite signal, which is fed to the master unit.

A satellite unit and a master unit for use in the system are also disclosed, as well as a method for receiving audio signals from a plurality of microphones and transferring the audio signals to a receiving unit via a common signal channel, such as a mixing console.

31 Claims, 7 Drawing Sheets

AUDIO RECEIVING SYSTEM

TECHNICAL FIELD

The present invention relates to a system for receiving audio signals from a plurality of microphones and transferring said audio signals to a receiving unit. More specifically, the invention relates to a microphone summing system for high-quality professional audio applications.

TECHNICAL BACKGROUND

At most audio performances today, some sort of amplification system is used in order for the sound to reach its audience, via TV, radio or via a speaker system. Such an amplification system normally delivers a single output signal (or two, if the signal is a stereo signal). However, that single output signal has to be composed of all the audio sources that are to be relayed to the audience. In a limited setting, with only one or a few speakers or singers, a single microphone is enough to receive all sources. At larger settings, such as live concerts of e.g. operas, theatres, musicals, rock or pop concerts, classical music concerts or similar events, a large number of sources, often spread out over a large area, needs to be relayed to the audience. In such a case, a large number of microphones needs to be used, often one microphone per source. The signal from each microphone is assigned its own channel, via a cable or a wireless transmission system, and may be received and recorded individually. However, at some point all channels need to be merged into a single channel (or into two channels in a stereo application), which may be relayed to the audience by e.g. amplification, broadcasting or recording.

A device commonly used for merging the channels is a mixing console 1, which is shown in FIG. 1. Mixing consoles are well known to any one involved with the recording or performance of music. Basically, the mixing console consists of a number of input channels that are added in order to form a single output channel.

Typically, one input channel 11*a*, 11*b* and 11*c* is assigned to each audio source, such as a microphone 10*a*, 10*b* and 10*c*, a CD player or any other audio source. Each channel may have its own equalizer 12*a*, 12*b* and 12*c* for adjusting its audio properties, and a level control 13*a*, 13*b* and 13*c* for controlling its contribution to the output channel 14. The mixing console may further comprise auxiliary blocks for enabling the outputting or listening-in to individual channels. It may also comprise a compressor gate for providing a compressed signal, which is suitable for radio broadcast. Mixing consoles may also be implemented with software user interfaces.

The output channel 14 may be connected to any downstream equipment, such as an amplifier 2 supplying signals to a speaker 3, broadcast equipment 4 for broadcasting signals to receivers 5 or equipment 6 for producing media such as CDs, tapes etc. The output channel typically has its own level control for controlling the output level from the mixing console.

It is easily realized that if each channel has its own equalizer, its own level control as well as its own input connector, the mixing console may become very large, especially since a mixing console may have a very large number of input channels. For example 32 or 48 channels is common, but there are also much larger mixing consoles for managing a large number of audio sources, such as an orchestra. However, in addition to becoming bulky, such mixing consoles have a tendency to become both heavy, expensive and difficult to operate. Needless to say, this could become a problem for any traveling performance group and for other applications where a large number of microphones needs to be repeatedly set up and disassembled, such as rehearsal studios, theatres, TV-studios etc.

It is generally not a very good idea to increase the number of sources that may be connected to a mixing console by connecting them via a splitter, so that two or more microphones become connected in parallel to one input channel. However, the number of microphones that may be connected in this manner is generally limited by the power supplied from the mixing console and by the microphones' characteristics. Typically, not more than two microphones may be connected to an input channel in this manner, and it is not recommended since the interdependence between the microphones may affect the sound quality negatively. Furthermore, this does not enable any control of the microphones' panning or signal levels.

Hence, there is a need for a device which enables a larger number of sources to be connected to a mixing console or an amplifier.

SUMMARY OF THE INVENTION

An object of the present invention is thus to provide an easy to use and economically advantageous system and method for connecting a plurality of microphones to a receiving unit, such as a mixing console.

The above object is achieved wholly or partially by a system according to claim 1, a master unit according to claim 21, a satellite unit according to claim 23 and a method according to claim 25. Preferred embodiments of the invention are set forth in the enclosed dependent claims and in the following description.

According to the invention, there is provided a system for receiving audio signals from a plurality of microphones and transferring the audio signals via a common composite signal channel to a receiving unit, such as a mixing console. The system comprises at least two satellite units, each having a microphone signal input, a composite signal channel input and summing means for summing a microphone signal and a composite signal. Furthermore, the system comprises a master unit having a composite signal channel input, and signal converting means for converting the composite signal into a master signal, which is provided to the receiving unit via a master signal output. Each satellite unit is connected to the common composite signal channel, such that the microphone signal received at the respective satellite unit, is added to said composite signal, which is fed to the master unit.

The satellite units may comprise a composite signal channel input and a composite signal channel output and the satellite units may be arranged such that the composite signal output of a first satellite unit is connected to the composite signal channel input of the master unit, and the composite signal output of a second satellite unit is connected to the composite signal input of the first satellite unit. Signals received at the composite signal input and at the microphone input of the respective satellite unit are added by the respective summing means and provided at the composite signal output.

Alternatively, the satellite units have only one composite signal channel connector, which via a T-connector is connected to said common composite signal channel. The composite signal channel connector may be connected to said T-connector directly or via a cable.

The system above enables the connection of a larger number of microphones per mixing channel, than would normally be possible when using prior art devices, without losing sound quality. Thus, the system will work as a microphone summing system. The composite signal may be e.g. a microphone signal, i.e. a signal at microphone level and impedance, or a line signal, having standard line signal level and impedance. Since the system is not very complex, it may also be very cost effective, especially compared with the prior art solution of acquiring a larger mixing console, Since the satellite units may be arranged near its respective microphone(s) and since the master unit may be arranged near the one of the satellite units, the wiring of the inventive system is quick and intuitive, which is advantageous when setting up e.g. a large orchestra. Typically, the microphones may be arranged within a few meters of the satellite unit. The master unit is typically arranged near one of the satellite units, while being connected to the receiving unit by means of cables that may be considerably longer than any of the microphone cables or the cables that are arranged between the satellite units.

Actually, the amount of wires may be reduced, since each microphone wire only goes as far as to its respective satellite unit and since there is only one cable between each pair of satellite units. Furthermore, the system is flexible since different numbers of satellite units may be used.

In the first embodiment, the satellite unit may have a dedicated input connector and a dedicated output connector. In the alternative embodiment, the satellite unit may have a connector which works as both input and output connector. Such an integrated input/output connector may be provided either in the form of a single connector having input conductors and output conductors, or in the form of a connector wherein the microphone signal from the satellite unit is merely superposed onto the composite signal. For the purposes of this application, a converting circuit may comprise any circuits that to at least some degree alter the physical properties of the signal with respect to e.g. level or format, such as digital or analog. The converting circuit may also provide a filtering or a balancing of the signal.

Preferably, the system comprises at least two common signal channels and each satellite unit comprises at least two microphone inputs, which are connected to a respective common signal channel.

This is advantageous since two channels, a right channel and a left channel is the most frequent setup. Also, having two microphone inputs in each satellite unit is very convenient, since some instruments in e.g. many classical orchestras, are grouped two by two. This is especially common for string sections. When using the system according to the invention, the microphones for each pair of instruments are connected to one satellite unit. Two channels: left and right, Suits e.g. an orchestra with its pairs of instruments, such as is the case with e.g. string orchestras.

In the preferred embodiment each satellite unit may also comprise panning control means for controlling the panning of the microphones and level control means for controlling the level of the signal from the microphone input. This enables accurate control of the contribution of each microphone to the common signal channel.

The satellite units' summing means may comprise a superposition circuit that is arranged to superpose the signals received at the composite signal input and at the microphone input. Alternatively, the summing means may comprise a summing circuit, such as an analog or a digital summing circuit. The superposition circuit has the advantage of having relatively low power consumption.

The converting means of the master unit may comprise an amplifier circuit, preferably one amplifier circuit per signal channel. The amplifier circuit may amplify the signal into a desired signal level. The converting means may further comprise a filter, e.g. in the form of a transformer or an electronic balancing circuit.

In the system according to the invention, the master signal may supplied from the master unit to the mixing console via first and second connectors, while the mixing console, via at least one of said first and second connectors supply operating power to at least the master unit. This eliminates or reduces the need for external power supply to the master unit.

The first connector may be arranged to receive operating power, which is supplied to at least the master unit and the second connector may be arranged to receive operating power, which is supplied to the satellite units as microphone operating power. This eliminates the need for external power supply to the satellite units and thereby also to the microphones. The microphone operating power may be e.g. a bias voltage or phantom power. Thus, the system according to the invention may draw all of its power through standard mixing console connectors.

According to the invention, the master unit and the satellite units may each be contained in a separate housing. Thus, the master unit and the satellite units may be physically separated form the receiving unit. The separate housings may be connected with standard type cables.

According to a second and a third aspect of the invention, there is provided a master unit and a satellite unit, respectively, for use with the system described above.

According to a fourth aspect of the invention, there is provided a method for receiving audio signals from a plurality of microphones and transferring said audio signals to a receiving unit via a common signal channel, such as a mixing console. The method comprises the steps of receiving a plurality of microphone signals at a plurality of satellite units, which are connected to a signal channel, adding said plurality of microphone signals to form a composite signal in said signal channel, receiving said composite signal in a master unit, converting said composite signal into a master signal, and providing said master signal to said receiving unit.

BRIEF DESCRIPTION OF THE DRAWINGS

The invention will be described in more detail with reference to the appended schematic drawings, which show examples of presently preferred embodiments of the invention.

DETAILED DESCRIPTION OF THE INVENTION

Figure 1:
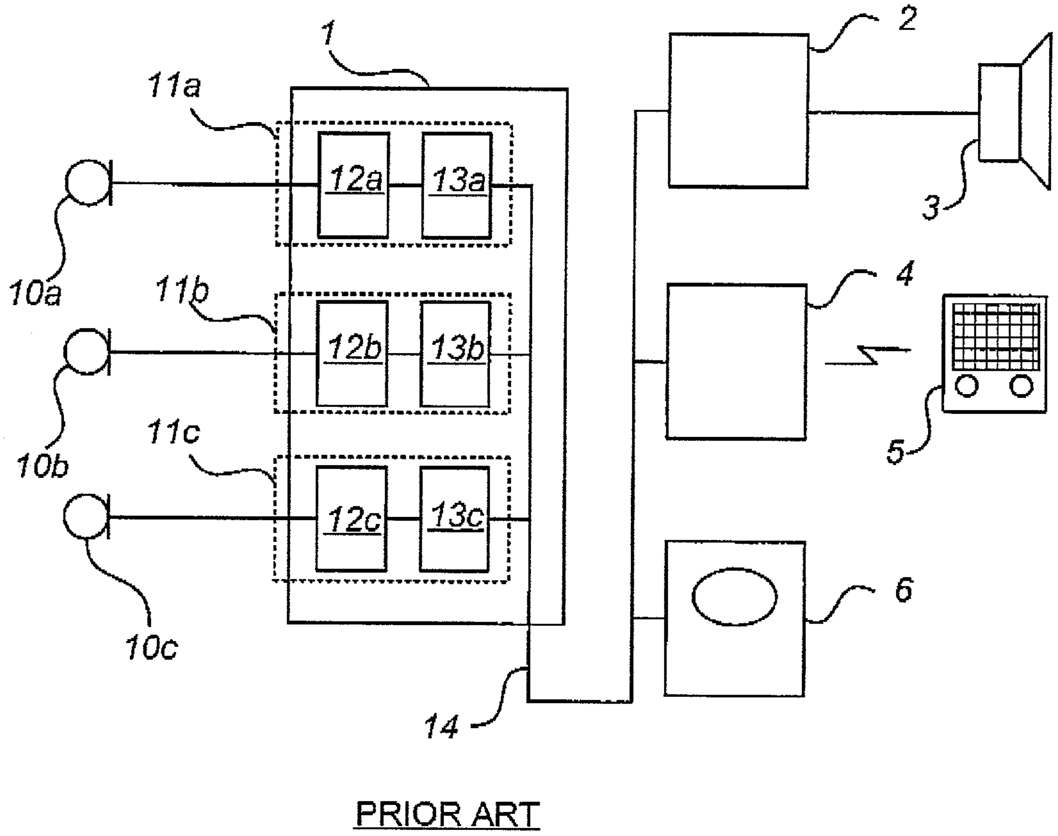
FIG. 1 is a schematic block diagram of a prior art mixing console.
Figure 2:
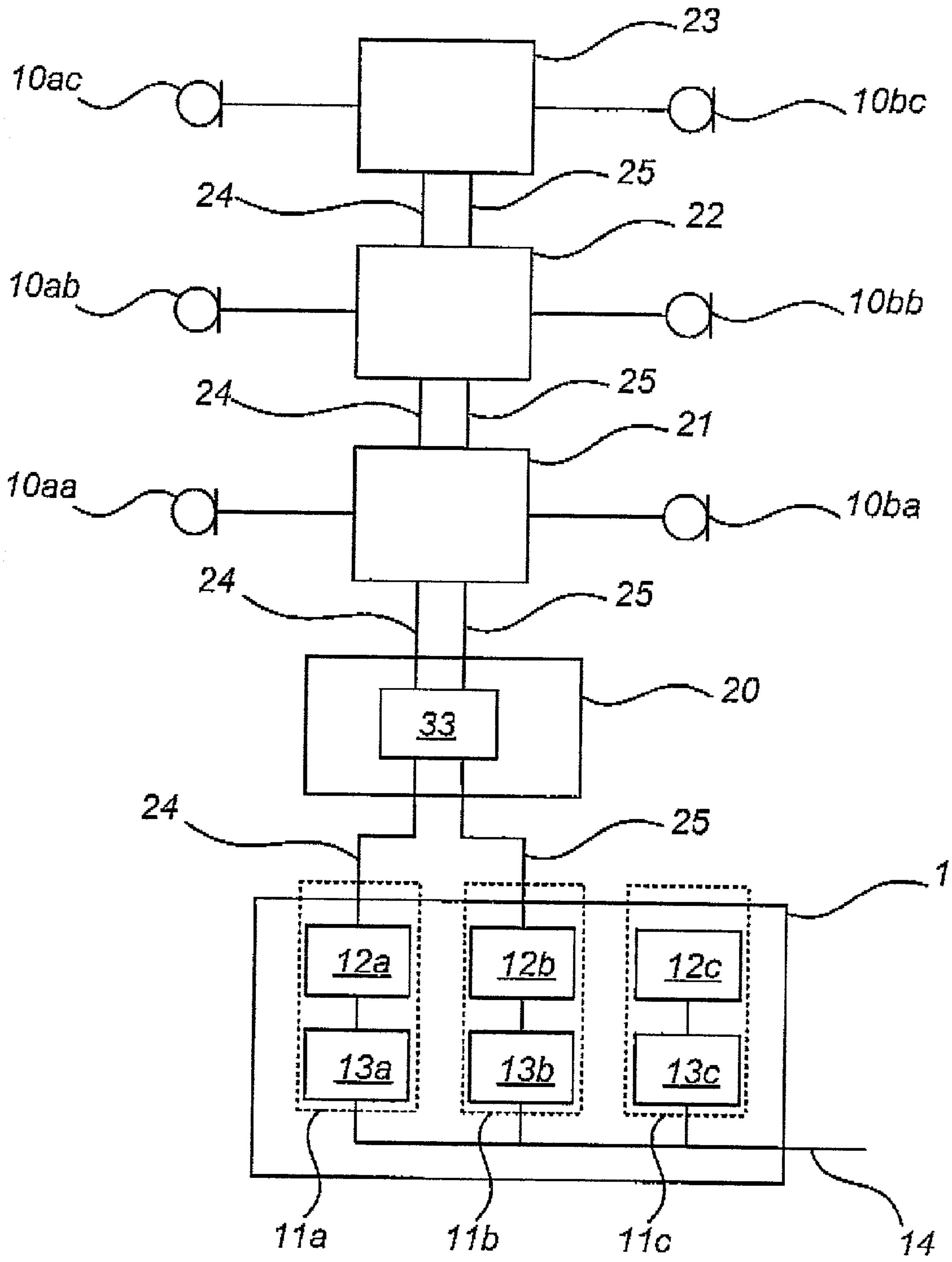
FIG. 2 is a schematic block diagram of a system according to the invention.

FIG. 2 is a schematic block diagram of a system according to an embodiment of the invention. The block diagram of FIG. 2 is simplified, so as to illustrate the general principle of the invention. In FIG. 2, a three-channel mixing console 1, such as the one described above in connection with the prior art, is used to provide an example of how the invention may function. The mixing console comprises a plurality of input channels 11*a,* 11*b* and 11*c,* each having an equalizer circuit 12*a,* 12*b* and 12*c,* respectively, a level control 13*a,* 13*b* and 13*c,* respectively, and an output channel 14 for providing an output signal.

A channel in this context may be a mono channel for providing a mono signal or a stereo channel for providing a stereo signal. Thus, the stereo channel may itself comprise two sub channels. The output channel 14 is typically a stereo channel, but the input channels 11*a,* 11*b* and 11*c* may be either mono or stereo channels. A mono channel is typically suitable for a mono source, such as a microphone, whereas a stereo channel may be suitable for a stereo source such as a CD player or a tape player.

An input channel 11*a,* 11*b* and 11*c* on a mixing console 1 may comprise not just a ground conductor and a signal conductor, but also a power conductor, for providing operating power, such as bias voltage or phantom power to a microphone or a microphone preamplifier. Naturally, a stereo input channel would comprise two signal conductors.

In FIG. 2, six microphones 10*aa,* 10*ab,* 10*ac,* 10*ba,* 10*bb* and 10*bc* are used as audio sources. The microphones are connected two by two to satellite units 21, 22 and 23 via microphone input connectors 38*a,* 38*b* (in FIG. 4), so that microphones 10*aa* and 10*ab* are connected to a first satellite unit 21, microphones 10*ba* and 10*bb* are connected to a second satellite unit 22 and microphones 10*ac* and 10*bc* are connected to a third satellite unit 23. The microphone input connectors may be standard type microphone connectors such as MicroDot connectors. Naturally, other connector types are possible.

Thus, microphones 10*aa,* 10*ab* and 10*ac* will be connected to a first signal channel 24 and microphones 10*ba,* 10*bb* and 10*bc* will be connected to a second signal channel 25. A signal channel is basically a channel into which a number of signals are merged or accumulated and subsequently processed or conveyed as a single, composite signal. For example, a signal channel may be a bus-type channel, in which the same signal may be found at any arbitrary point on the channel. Alternatively, a signal channel may be composed of a number of interconnected summing circuits, which each receive a signal from an upstream summing circuit, adds an incoming signal and outputs a composite signal.

Figure 4:
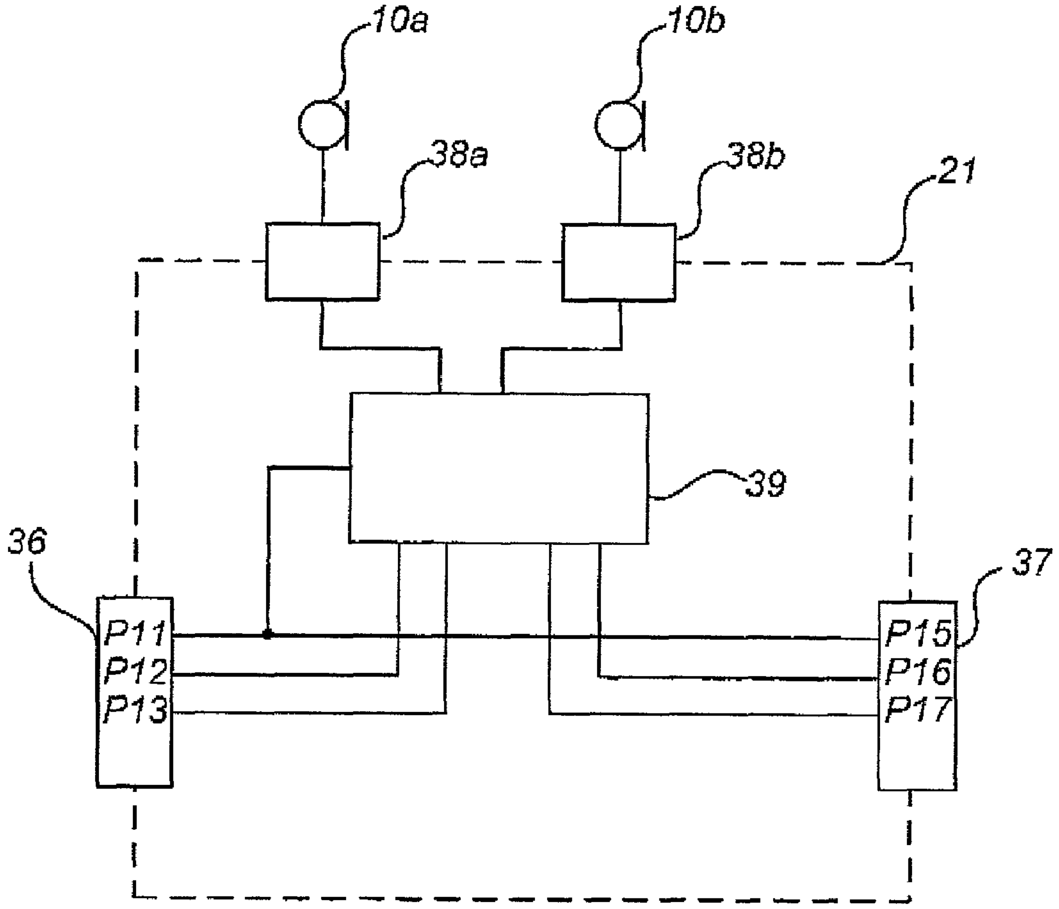
FIG. 4 is a schematic block diagram of a satellite unit according to the invention.

Furthermore, as is understood from FIG. 4, each satellite unit 21, 22 and 23 is provided with an input connector 36 and an output connector 37, which are adapted to receive a composite signal to and to provide a composite signal from each satellite unit 21, 22 and 23 to other satellite units 21, 22 or 23 or to a master unit 20.

In each satellite unit 21, 22 and 23, a signal from a microphone is received via the microphone input connector 38*a* or 38*b* and added to the composite signal received via the input connector 36. The composite signal, comprising both the received composite signal and the microphone signal, is provided via the output connector 37 to another satellite unit or to the master unit.

The embodiment illustrated in FIG. 2 is a two-channel configuration, which may be suitable for a stereo application, wherein a left channel 24 and a right channel 25 are present. In this embodiment, signals from microphones that are dedicated for the left channel may be balanced to the left channel 24, while signals from microphones that are dedicated for the right channel may be balanced to the right channel 25. Hence, the signals from microphones 10*aa,* 10*ab* and 10*ac* constitute the left channel 24, while the signals from microphones 10*ba,* 10*bb* and 10*bc* constitute the right channel.

A number of satellite units may be connected in a series, such as is illustrated in FIG. 2, where signals from microphones 10*ac* and 10*bc* are received by the third satellite unit 23 and provided as composite signals to the second satellite unit 22. In the second satellite unit 22, signals from microphones 10*ab* and 10*bb* are received and added to the composite signals provided by the third satellite unit 23, whereby new composite are provided to the first satellite unit 21. Similar to the second satellite unit, the first satellite unit 21 receives signals from microphones 10*aa* and 10*ba,* adds the signals to the composite signals received from the second satellite unit 22 and provides new composite signals to the master unit 20.

In the embodiment described, three satellite units are used, but it is possible to connect a number of further satellite units to the third satellite unit 23 in the same manner as the first 21, second 22 and third 23 satellite unite are interconnected. Applicant has successfully interconnected up to seven satellite units, but it is possible that even more could be connected. It is also possible to use only one satellite unit with the system according to the invention.

In FIG. 2, the signals from the first satellite unit 21 are provided to a master unit 20. The master unit converts the signals received from the first satellite unit 21 into signals of the proper format for input to the mixing console.

In the embodiment illustrated in FIG. 2, the left channel 24 and the right channel 25 from the master unit 20 are connected to two input channels 11*a,* 11*b* of the mixing console 1. The input channels 11*a,* 11*b* may be mono or stereo input channels. Thus, the input channel 11*a* will receive the signals from the left channel 24 and the input channel 11*b* will receive the signals from the right channel 25.

Input channels 11*a,* 11*b* and 11*c* in a mixing console 1 may comprise a power supply conductor for supplying power, e.g. phantom power, to the equipment supplying signals to the input channel, such as a microphone and/or a microphone preamplifier, which may be included in some types of microphones.

Figure 3:
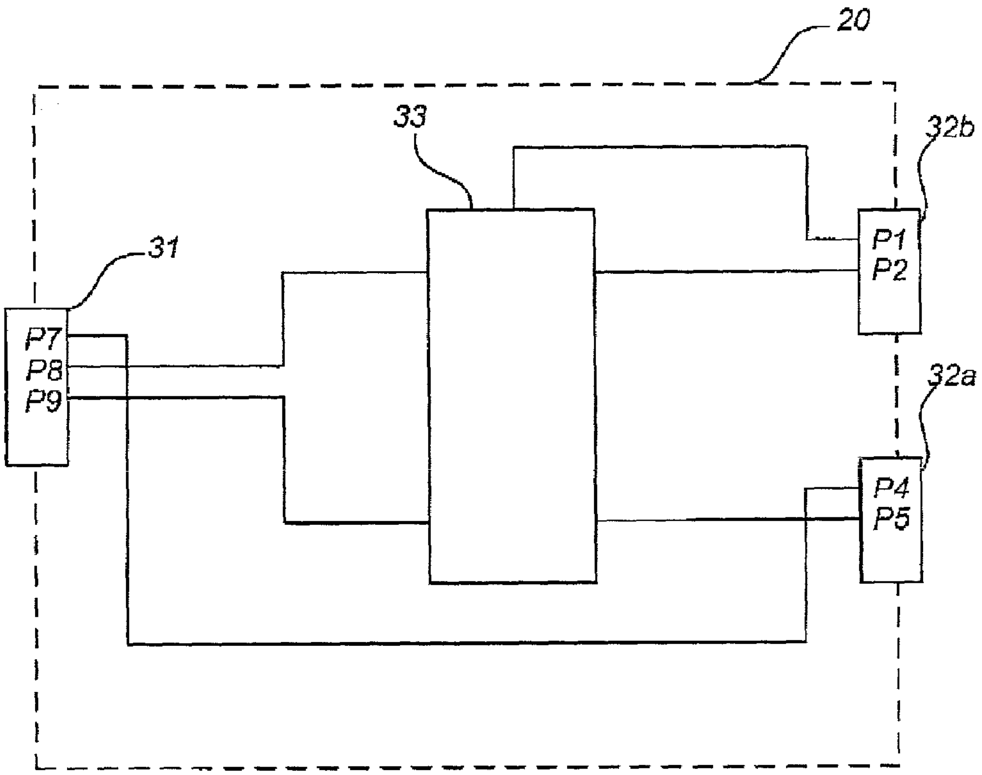
FIG. 3 is a schematic block diagram of a master unit according to the invention

FIG. 3 is a schematic block diagram of a master unit 20 according to the invention. The master unit 20 comprises a master input connector 31 for receiving signals from the satellite units 21, 22 and 23, as well as for providing the necessary operating power to the satellite units. The master unit 20, according to the embodiment, also comprises two master output connectors 32*a* and 32*b,* which are connected to the input channels 11*a* and 11*b,* respectively, of the mixing console 1. The master unit 20 further comprises a converting circuit 33 for converting the signals received from the satellite units into a suitable format or level for the mixing console 1. The converting circuit may also comprise functionality for filtering the signals in order to remove noise such as humming or ground loops, as well as interference signals resulting from e.g. induction sources near the cables, such as radio transmitters or radiators.

Figure 5:
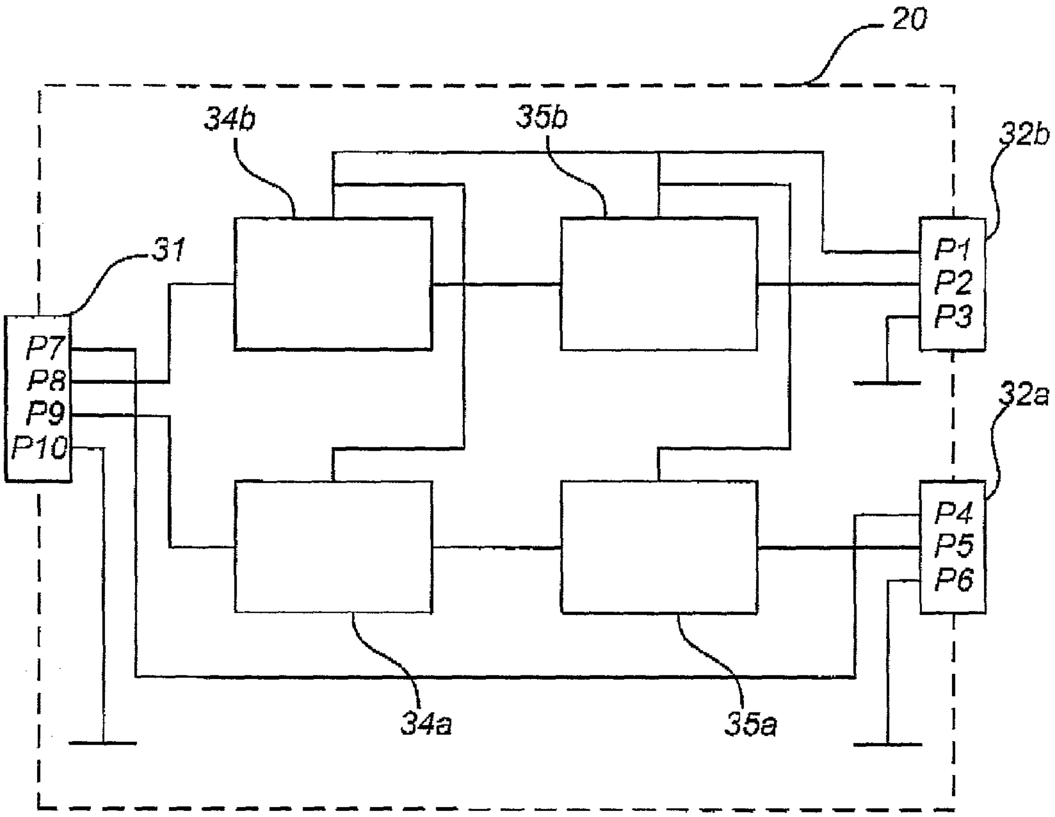
FIG. 5 is a schematic block diagram of a preferred embodiment of a master unit according to the invention.

The master output connectors 32*a* and 32*b* may be of the type that comprises a signal conductor P5 and P2 respectively, and a power conductor P1 and P4, respectively. All connectors used herein typically also comprise ground conductors, which in FIGS. 3-5 are left out in order to simplify the drawings.

In the embodiment described herein, the master unit 20 and the satellite units 21, 22 and 23 are powered by the mixing console's built in power supply, such that the converting circuit 33 in the master unit 20 is powered by the power conductor P1 of the master output connector 32*b.* The satellite units 21, 22 and 23, and the microphones connected thereto, are powered by the power conductor P4 of the master output connector 32*a.*

The master input connector 31 comprises two signal conductors P8 and P9, conducting signals from the respective right and left channels 24, 25. Furthermore, the master input connector 31 comprises a power conductor which conveys the power from the master output connector 32*a* to the satellite units 21, 22 and 23.

FIG. 4 is a schematic block diagram of the satellite unit 21, 22 and 23 according to the invention. Each satellite unit 21, 22 and 23 comprises a satellite input connector 36, a satellite output connector 37 and two microphone connectors 38*a* and 38*b*, respectively, for receiving signals from the microphones 10*a* and 10*b*, respectively. The satellite unit further comprises an adding circuit 39 for adding the signals from the microphones to the composite signal received, from the satellite input connector 36, in order to provide the composite signal which is output via the satellite output connector 37 to another satellite or to the master unit. The satellite input and output connectors 36, 37 may be of the same type as the master input connector 31, and thus comprise a power conductor P11 and P15 respectively, and two signal conductors P12, P16 and P13, P17 respectively. Typically, a ground connector (not shown) may be comprised in the connector.

The adding circuit 39 has functionality for adding the signals from the microphones 10*a*, 10*b* to the incoming composite signals, if any, so that the outgoing composite signals are formed. If the incoming composite signals are zero, as would be the case when the satellite is at the end of the series of satellite units, then the output signals would merely represent the signals received from the microphones 10*a*, 10*b*. The adding circuit may also be provided with further functionality, such as panning controls for controlling the balance of the microphone signals in relation to each other, and a level control, which controls the amount of contribution each microphone provides to each channel. The level control may be an attenuation control or a gain control.

Figure 6:
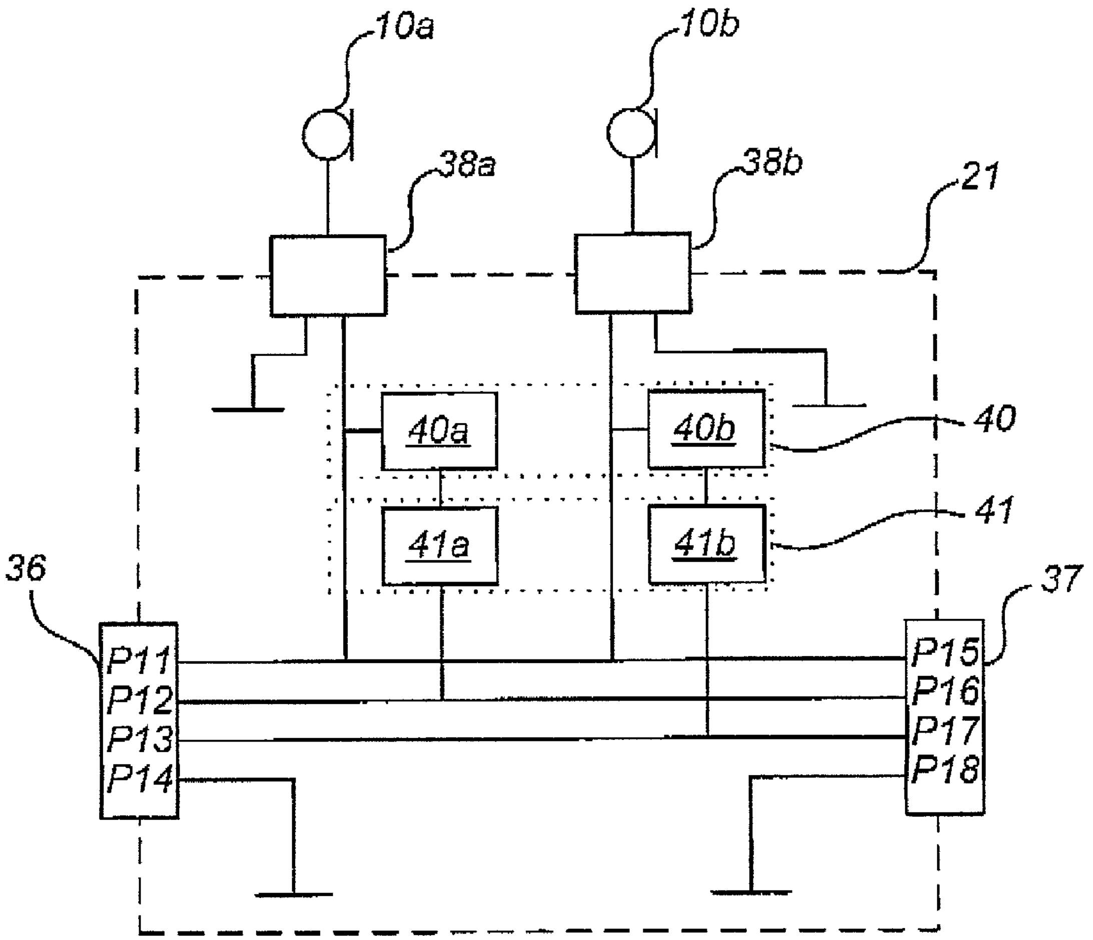
FIG. 6 is a schematic block diagram of a preferred embodiment of a satellite unit according to the invention.

FIGS. 5 and 6 schematically illustrate a preferred embodiment of the invention. In this embodiment, a signal channel is formed, which originates in the master unit and to which the microphones are connected. The microphone signals are received at the satellite units and superposed on the signal channel by the adding circuit of the satellite units. The exact design and choice of components for the embodiment described is dependent on the type of microphones used and thus not considered essential to the invention.

FIG. 5 is a schematic block diagram of a preferred embodiment of a master unit 20 according to the invention.

The master unit 20 illustrated in FIG. 5 comprises amplifier circuits 34*a* and 34*b*, which are adapted to amplify the composite signals received via conductors P9 and P8, respectively, of the master input connector 31. The signals may need amplifying since the use of a plurality of microphones on each channel, 24 and 25, together with only one power supply (from conductor P4 of master output connector 32*a* in the embodiment illustrated in FIG. 5) that is used for both channels 24 and 25, may make the received signals weaker than what would normally be the case when only one microphone is connected to the input channel 11*a* and 11*b*, respectively, of the mixing console 1.

The amplifier circuits 34*a* and 34*b* may be powered by the power connector P1 of other master output connector 32*b*. The power supply for the amplifier circuits 34*a* and 34*b* may be connected to ground via a voltage divider comprising a resistor and a filter capacitor.

Furthermore, it may be advantageous to limit the voltage supplied to the amplifier circuits by means of a voltage controlling diode, which couples any excess voltage to ground. Amplifier output may be filtered in order to remove any DC signals. The amplifier circuits 34*a*, 34*b* may be connected in a negative feedback loop with a fixed capacitor and resistor, unless variable amplification is desirable. The amplifier circuits may be standard type high-quality operational amplifiers.

The master unit 20 illustrated in FIG. 5 may further comprise transformers 35*a* and 35*b* for filtering the signals in order to remove noise, such as e.g. humming or ground loops. A transformer may also provide filtering by galvanic separation for elimination of double grounding and for providing a stable signal. The transformer may also provide balancing of the signal.

The transformers are preferably high-quality Lundahl transformers, which are commercially available from Lundahl Transformers AB, Norrtälje, Sweden, and which are designed for use in audio systems. Another manufacturers of suitable transformers is e.g. Jensen Transformers, Inc., Van Nuys, Calif. U.S.A.

The operating power to the satellite units 21, 22 and 23 and thereby to the microphones may be drawn from P4 of the master output connector 32*a*. The microphone operating power could also be filtered by means of a capacitor and excess currents may be grounded by means of a voltage controlling diode, which couples any excess voltage to ground.

FIG. 6 is a schematic block diagram of a preferred embodiment of a satellite unit 21, 22 and 23 according to the invention. The adding circuit 39 (FIG. 4) of the satellite unit 21, 22 and 23, illustrated in FIG. 6 comprises panning controls 40*a*, 40*b* and attenuation controls 41*a*, 41*b* for the respective microphones 10*a*, 10*b*.

The panning controls 40*a* and 40*b* may be potentiometers, either in the form of separate components or in the form of an integrated component, which simultaneously pans both channels, or which pans one channel at a time, depending on the position of a pan channel selector switch.

The attenuation controls 41*a*, 41*b* may also be potentiometers, either in the form of separate components or in the form of an integrated component, which controls the attenuation of both channels simultaneously.

The operating power received from the master unit via P11 of satellite input connector 36 may be adapted to fit the type of microphones that are intended to be used. Also, the microphones may need the protection or capacitors in order to remove any DC currents. The impedance of the satellite unit is preferably controlled by the use of output resistors. By using a resistor with a higher resistance, the impedance of the satellite unit increases and its effect on the overall system is decreased. This may be advantageous when a large number of satellite units is to be used. The output signal may also be filtered by means of a capacitor for stabilizing and filtering the signals to the potentiometers.

Generally, the master unit 20 and the satellite units 21, 22 and 23 are provided as separate elements, in separate housings, which are interconnected by cables.

The master unit 20 is typically connected to the mixing console via cables as well. In the preferred embodiment, XLR-type cables are used, since they provide good signal quality, are relatively insensitive to external noise sources, and since they are commonly used in professional audio contexts. XLR cables are available in many forms and with different number of poles. XLR cables and connectors having three, four or five poles are commercially available. The connectors may be either XLR connectors that are attached directly to the circuit board by being e.g. soldered in the respective master or satellite unit, or chassis-mounted XLR connectors which are attached to the unit's housing and then wired to connection pads on the circuit board.

Figure 7:
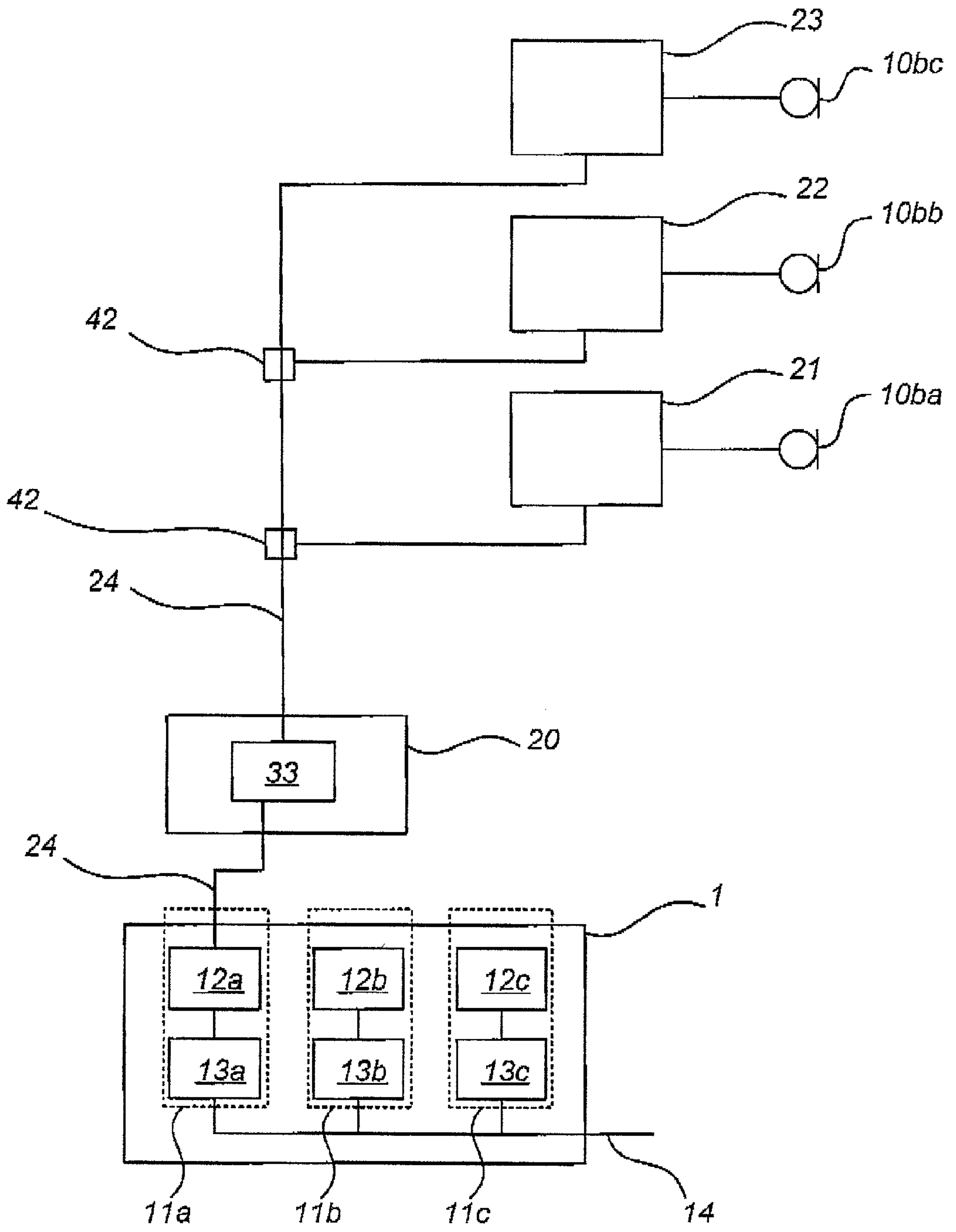
FIG. 7 is a schematic block diagram of an alternative embodiment of the invention.

FIG. 7 is a schematic block diagram of an alternative embodiment of the invention. In order to simplify the description, the embodiment illustrated in FIG. 7 comprises only one composite signal channel 24, but it realized that the embodiment may be extended to comprise any number of composite signal channels.

In FIG. 7, each satellite unit has only one composite signal channel connector. A plurality of satellite units are connected to a single signal channel, by use of T-connectors 42. The signal channel cable basically forms a continuous channel having a plurality T-connectors which serve as branch connectors, where satellite units tap into the signal channel cable. If a 4-pol cable is used, the signal channel cable may be capable of carrying power supply, ground and two signal channels. The Satellite units may be connected to the T-connectors either directly via its composite signal channel connector or via a cable between the T-connector and the composite signal channel connector.

As an alternative to the embodiment described above, summing operational amplifiers may be used in the satellite units. In such an embodiment, the composite input signal and the microphone signal are supplied to the input side of the operational amplifier, so that a sum signal is obtained.

The embodiments shown in FIGS. 4 and 5 may very well also be implemented using digital circuits, instead of analog ones as were described above.

Thus, the converting circuit 33 of FIG. 3 may be one or more digital circuits having functionality for A/D and/or D/A conversion, signal amplification and signal filtering. The incoming signal to the master unit may be a digital signal provided by the satellite units or an analog signal, which is digitized in the master unit. The signal provided to the mixing console may be a digital or an analog signal.

The converting circuit in the master unit may even be implemented as a digital signal processor, DSP, provided with the appropriate software to perform some or all of the functions described above.

Also, the adding circuit 39 of FIG. 4 may be one or more digital circuits having functionality for A/D conversion of the received microphone signals, and for receiving digital incoming composite signals, adding the digitized microphone signals and providing an outgoing digital signal to another satellite unit or to the master unit. It is also possible that the addition is done digitally and is followed by a D/A conversion step, so that an analog signal is provided.

In the digital embodiment, different connectors and cables may be used, such standard MIDI cables or even standard data cables, such as serial, parallel, USB, FIREWIRE or the like. The use of digital cables may have the advantage that the influence of noise incurred from devices near the cables is reduced.

The embodiments described above are adapted for use with pre-polarized condenser microphones, such as those provided by DPA Microphones A/S, Alleroed, Denmark. However, it is possible to adapt the satellite unit and/or the master unit for use with other types of microphones, such as dynamic microphones, electret condenser microphones, ribbon microphones and carbon microphones. It is also possible to use stereo microphones, i.e. microphones with two microphones built into one housing and which provide a two-channel output.

Furthermore, the converting circuit 33 of the master unit 20 described above and/or the satellite units 21, 22 and 23 may be powered by means of an external power supply, which is connected to the master unit or to any of the satellite units in a suitable manner.

The power supply to the master unit may be provided via the mixing unit's microphone connectors, which typically are capable of supplying phantom power, as described above. Alternatively, the master signal may be provided to the mixing unit as a standard line signal, and the power supply may be drawn from any other source, e.g. a battery, a supply mains or from a microphone connector capable of supplying phantom power.

As an alternative to the transformers described in connection with FIGS. 6 and 8, it is possible to use electronic balancing circuits, which have higher power consumption.

It is also possible to provide the level control in the form of a gain control instead of the attenuation control described in connection with FIGS. 5 and 7.

A system comprising the master unit 20 and one or more satellite units may be sold as a kit of parts, which is assembled into the system described above. It is also possible to provide a master unit having several master input connectors, for being able to receive several series of satellite units.

The invention claimed is:

1. A system for receiving audio signals from a plurality of microphones and transferring said audio signals via (a) common composite signal channels to a receiving unit, said system comprising:

at least two satellite units, each having a separate housing, a microphone signal input, a composite signal channel input, and summing means for summing a microphone signal and a composite signal; and a master unit having two composite signal channel inputs, and signal converting means for converting said composite signal channel inputs into at least one master signal, which is provided to the receiving unit via (a) master signal outputs; wherein each satellite unit is positionable away from the receiving unit and connected to a different one of said common composite signal channels, such that the microphone signal received at the respective satellite unit, is added to said different one of said common composite signal channels, which is fed to the master unit; and wherein said master unit is arranged to supply operating power to the satellite units.

2. The system as claimed in claim 1, wherein at least one of said satellite units comprises a composite signal channel input and a composite signal channel output, and wherein the composite signal output of a first satellite unit is connected to the composite signal channel input of the master unit;

the composite signal output of a second satellite unit is connected to the composite signal input of the first satellite unit; and signals received at the composite signal input and at the microphone signal input of the respective satellite unit are added by the respective summing means and provided at the composite signal output.

3. The system as claimed in claim 1, wherein at least one of said satellite units has one composite signal channel connector, which via a T-connector is connected to said common composite signal channel.

4. The system of claim 3, wherein said composite signal channel connector is connected to said T-connector via a cable.

5. The system as claimed in claim 1, wherein each satellite unit comprises at least two microphone inputs, which are connected to a respective common composite signal channel.

6. The system as claimed in claim 5, wherein each satellite unit comprises panning control means for controlling the panning of the microphones.

7. The system as claimed in claim 1, wherein each satellite unit comprises level control means for controlling the level of the signal from the microphone input.

8. The system as claimed in claim 7, wherein said level control means comprises an attenuation control.

9. The system as claimed in claim 7, wherein said level control means comprises a gain control.

10. The system as claimed in claim 1, wherein said summing means comprise a superposition circuit, arranged to superpose the microphone signal onto the composite signal.

11. The system as claimed in claim 1, wherein said summing means comprise a summing circuit.

12. The system as claimed in claim 11, wherein said summing circuit is an analog summing circuit.

13. The system as claimed in claim 11, wherein said summing circuit is a digital adding circuit.

14. The system as claimed in claim 1, wherein said signal converting means comprise an amplifier circuit.

15. The system as claimed in claim 1, wherein said signal converting means comprise a transformer.

16. The system as claimed in claim 1, wherein said signal converting means comprise an electronic balancing circuit.

17. The system as claimed in claim 12, wherein said master signal is an audio signal adapted for standard mixing console inputs.

18. A system for receiving audio signals from a plurality of microphones and transferring said audio signals via a plurality of common composite signal channels to a receiving unit, said system comprising:

at least two satellite units, each having a separate housing, a microphone signal input, a composite signal channel input, and summing means for summing a microphone signal and a composite signal; and a master unit having two composite signal channel inputs, and signal converting means for converting said composite signal channel inputs into master signals, which are provided to the receiving unit via (a) master signal outputs; wherein each satellite unit is positionable away from the receiving unit and connected to a different one of said common composite signal channels, such that the microphone signal received at the respective satellite unit, is added to said different one of said common composite signal channels, which is fed to the master unit; and said master unit is arranged to supply operating power to the satellite units and said receiving unit is a mixing console.

19. A system for receiving audio signals from a plurality of microphones and transferring said audio signals via (a) common composite signal channels to a receiving unit, said system comprising:

at least two satellite units, each having a microphone signal input, a composite signal channel input, and summing means for summing a microphone signal and a composite signal; and a master unit having two composite signal channel inputs, and signal converting means for converting said composite signal channel inputs into (a) first and second master signals, which are provided to the receiving unit via (a) said first and second master signal outputs; wherein each satellite unit is connected to a different one of said common composite signal channels, such that the microphone signal, received at the respective satellite unit, is added to said different one of said common composite signal channels, which is fed to the master unit;

said system comprises at least two common composite signal channels;

and said first and second master signals are supplied from the master unit to the receiving unit via first and second connectors and wherein the receiving unit, via at least one of said first and second connectors, supply operating power to at least the master unit.

20. The system as claimed in claim 19, wherein said first connector is arranged to receive operating power, which is supplied to at least the master unit and said second connector is arranged to receive operating power, which is supplied to the satellite units as microphone operating power.

21. The system as claimed in claim 20, wherein said microphone operating power is one of a bias voltage and a phantom power.

22. The system as claimed in claim 1, wherein said master unit and said satellite units each is contained in a separate housing, and wherein said master unit and satellite units are interconnected by cables.

23. The system as claimed in claim 1, wherein said satellite units are arranged near a respective microphone, and said master unit is arranged near said satellite unit.

24. A master unit for use in a system for receiving audio signals from a plurality of microphones and transferring said audio signals via a common composite signal channel to a receiving unit, said system comprising:

at least two satellite units, each having a separate housing, a microphone signal input, a composite signal channel input, and summing means for summing a microphone signal and a composite signal; and a master unit having a composite signal channel input, and signal converting means for converting a composite signal into a master signal, which is provided to the receiving unit via a master signal output; wherein each satellite unit is positionable away from the receiving unit and connected to said common composite signal channel, such that the microphone signal received at the respective satellite unit, is added to said composite signal, which is fed to the master unit; and wherein said master unit is arranged to supply operating power to the satellite units, said master unit comprising including:

a composite signal input connector for receiving a composite signal from a plurality of separately housed satellite units;

signal converting means for converting the composite signal into a master signal, and a master signal output connector for providing said master signal to a receiving unit and said master signal output connector comprises first and second connectors, wherein said first connector is arranged to provide a first signal channel to the receiving unit and to receive operating power for at least the master unit, and wherein said second connector is arranged to provide a second signal channel to the receiving unit and to receive operating power for the satellite units.

25. A satellite unit for use in a system for receiving audio signals from a plurality of microphones and transferring said audio signals via two common composite signal channels to a receiving unit, said system comprising:

at least two satellite units, each having a separate housing, a microphone signal input, a composite signal channel input, and summing means for summing a microphone signal and a composite signal; and a master unit having two composite signal channel inputs, and signal converting means for converting said composite signal channel inputs into master signals, which are provided to the receiving unit via two master signal outputs; wherein each satellite unit is positionable away from the receiving unit and connected to a different one of said common composite signal channels, such that the microphone signal received at the respective satellite unit, is added to said different one of said common composite signal channels, which is fed to the master unit; and said master unit is arranged to supply operating power to the satellite units, said satellite unit including:

a composite signal channel connector for receiving a composite signal; a microphone input connector for receiving a microphone signal, and summing means for summing said composite signal and said microphone signal, wherein and said composite signal channel connector is adapted for receiving microphone operating power.

26. The system as claimed in claim 1, wherein said master unit and at least one of said satellite units are interconnected by a first cable.

27. The system as claimed in claim 26, wherein said composite signal channel is arranged to be propagated between the satellite unit and the master unit by said first cable.

28. The system as claimed in claim 26, wherein said first cable is arranged to propagate said composite signal channel and said operating power.

29. The system as claimed in claim 26, wherein said at least two satellite units are interconnected by a second cable.

30. The system as claimed in claim 29, wherein said composite signal channel is arranged to be propagated between said satellite units by said second cable.

31. The system as claimed in claim 29, wherein said second cable is arranged to propagate said composite signal channel and said operating power between said satellite units.

* * * * *